(12) United States Patent
Kim et al.

(10) Patent No.: US 11,093,076 B2
(45) Date of Patent: Aug. 17, 2021

(54) DISPLAY APPARATUS HAVING TOUCH FUNCTION AND SIGNAL LINE METHOD OF MOUNTING SIGNAL LINE OF DISPLAY APPARATUS

(71) Applicant: G2TOUCH CO., LTD., Seongnam (KR)

(72) Inventors: Hyung Guel Kim, Seongnam (KR); Jong Bae Lee, Seongnam (KR); Ki Hwan Oh, Seongnam (KR); Hwa Joo Noh, Seongnam (KR)

(73) Assignee: G2TOUCH Co., LTD., Seongnam (KR)

( * ) Notice: Subject to any disclaimer, the term of this patent is extended or adjusted under 35 U.S.C. 154(b) by 0 days.

(21) Appl. No.: 16/969,893

(22) PCT Filed: Mar. 4, 2019

(86) PCT No.: PCT/KR2019/002457
§ 371 (c)(1),
(2) Date: Aug. 13, 2020

(87) PCT Pub. No.: WO2019/172583
PCT Pub. Date: Sep. 12, 2019

(65) Prior Publication Data
US 2021/0011572 A1    Jan. 14, 2021

(30) Foreign Application Priority Data
Mar. 5, 2018 (KR) ........................ 10-2018-0025854

(51) Int. Cl.
*G06F 3/041* (2006.01)

(52) U.S. Cl.
CPC ........ *G06F 3/04164* (2019.05); *G06F 3/0412* (2013.01); *G06F 3/04166* (2019.05);
(Continued)

(58) Field of Classification Search
CPC ......... G06F 3/041–047; G06F 3/04164; G02F 1/1345; G02F 1/13452
See application file for complete search history.

(56) References Cited

U.S. PATENT DOCUMENTS

2014/0246687 A1* 9/2014 Ha ........................ G06F 1/1626
257/88
2017/0262109 A1* 9/2017 Choi ................... G06F 3/04164

FOREIGN PATENT DOCUMENTS

| KR | 1020160085388 A | 7/2016 |
|---|---|---|
| KR | 1020160090978 A | 8/2016 |

(Continued)

*Primary Examiner* — Sanjiv D. Patel

(57) ABSTRACT

The present invention relates to a design for optimally mounting a Touch Drive (IC) (TDI) signal line and a Display Drive IC (DDI) signal line of a display apparatus having a touch function. According to the display apparatus having a touch function and the method of mounting the signal line of the display apparatus according to the present invention, the TDI signal line and the DDI signal line are mounted so as not to overlap in the bending region on the same flexible substrate, thereby preventing the problem, such as cracks, in the related art. Further, according to the display apparatus having a touch function and the method of mounting the signal line of the display apparatus according to the present invention, it is possible to easily manufacture a full-screen display apparatus by reducing a length of a fan-out area of the TDI signal line.

14 Claims, 6 Drawing Sheets

(52) U.S. Cl.
CPC .............. *G06F 2203/04102* (2013.01); *G06F 2203/04103* (2013.01)

(56) References Cited

FOREIGN PATENT DOCUMENTS

| KR | 1020160110861 A | 9/2016 |
| KR | 1020170057090 A | 5/2017 |
| KR | 1020180018034 A | 2/2018 |

\* cited by examiner

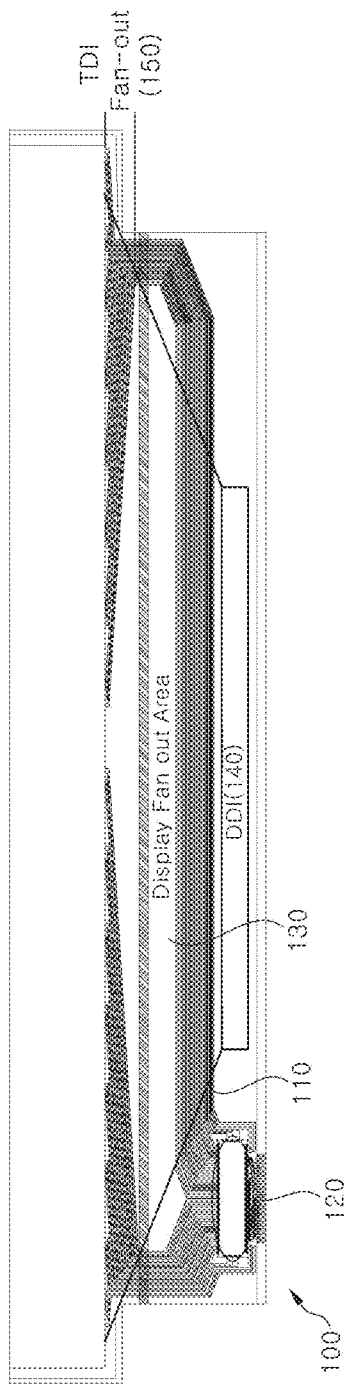
[FIG. 1]

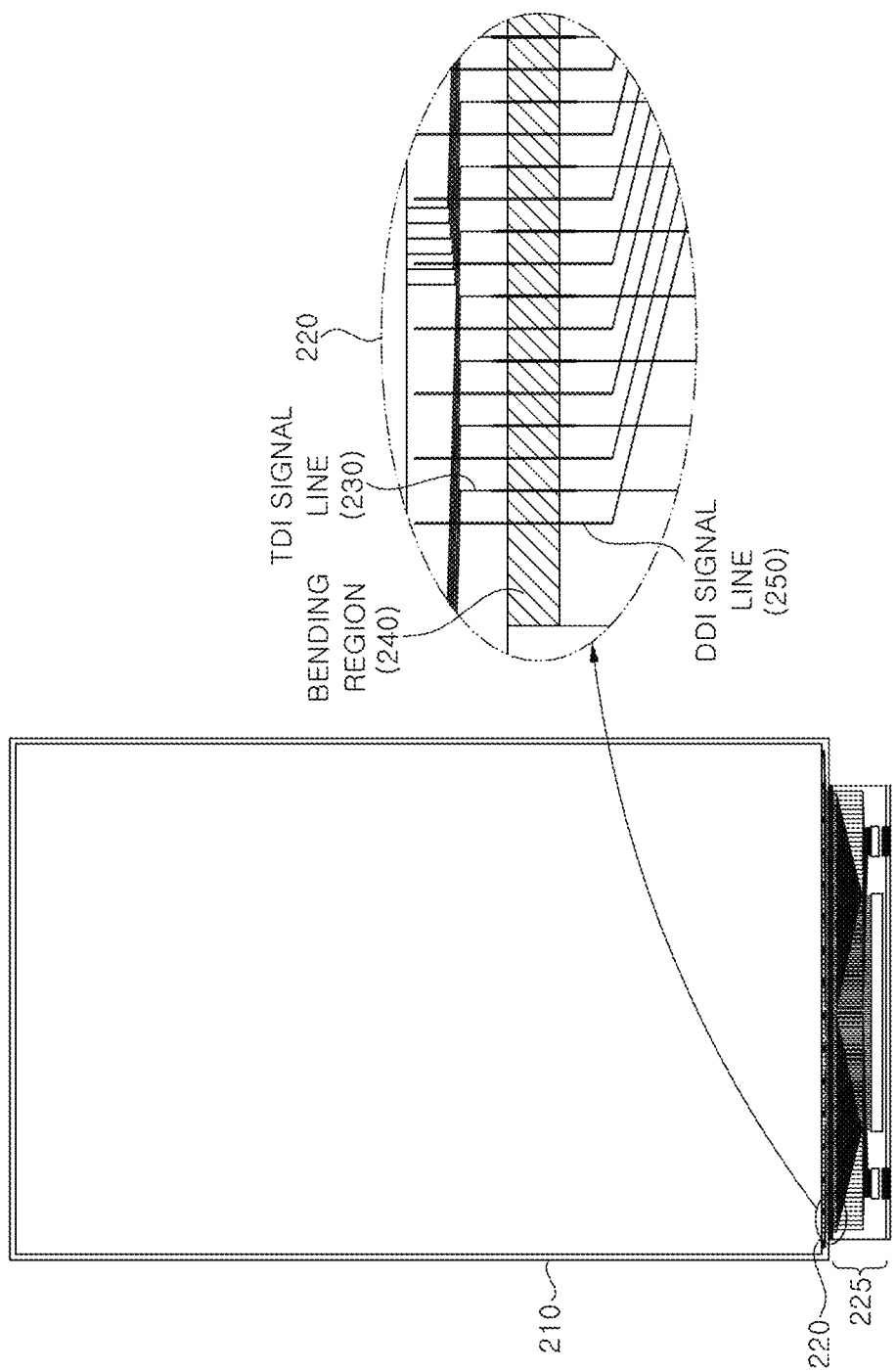
[FIG. 2A]

[FIG. 2B]
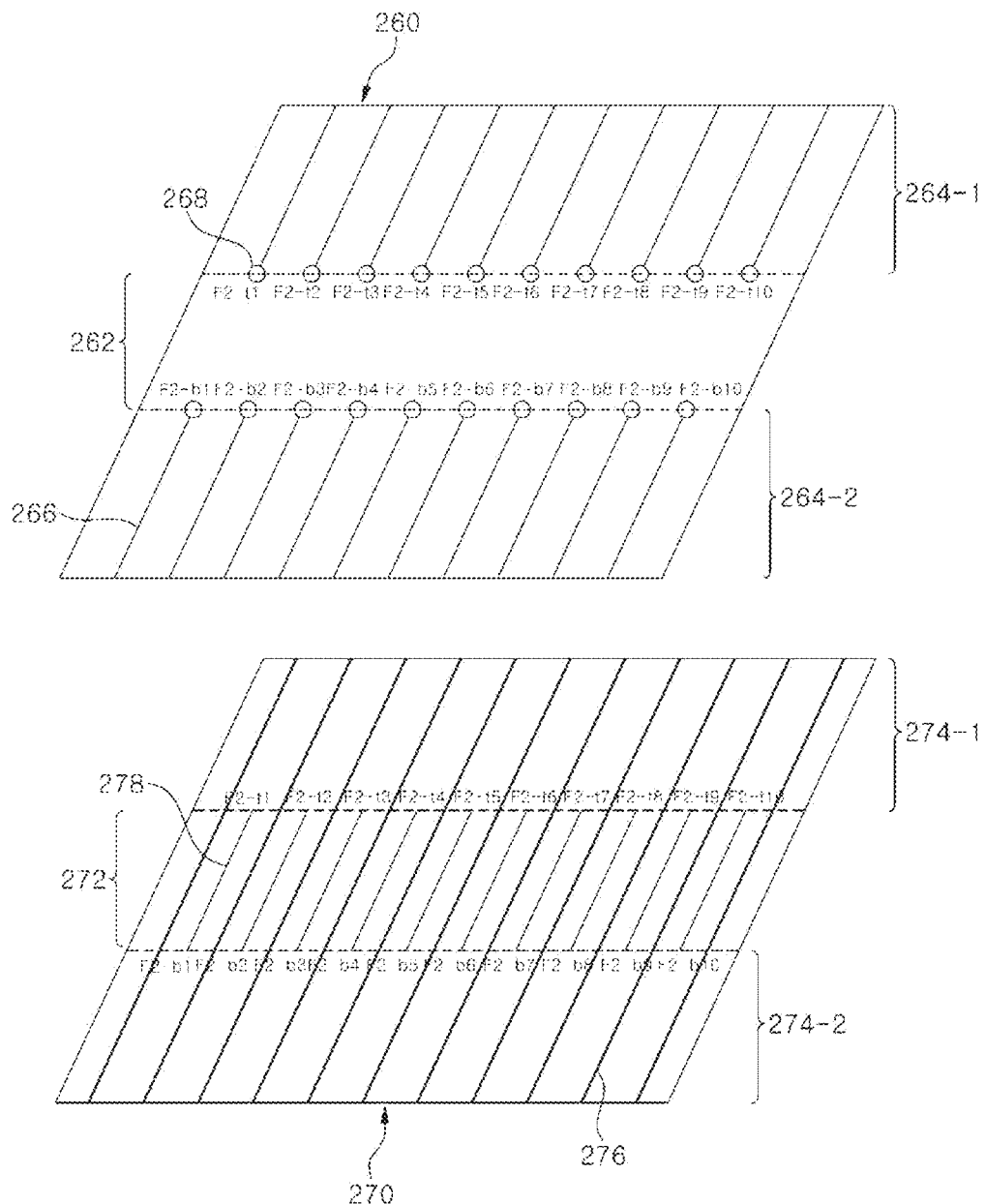

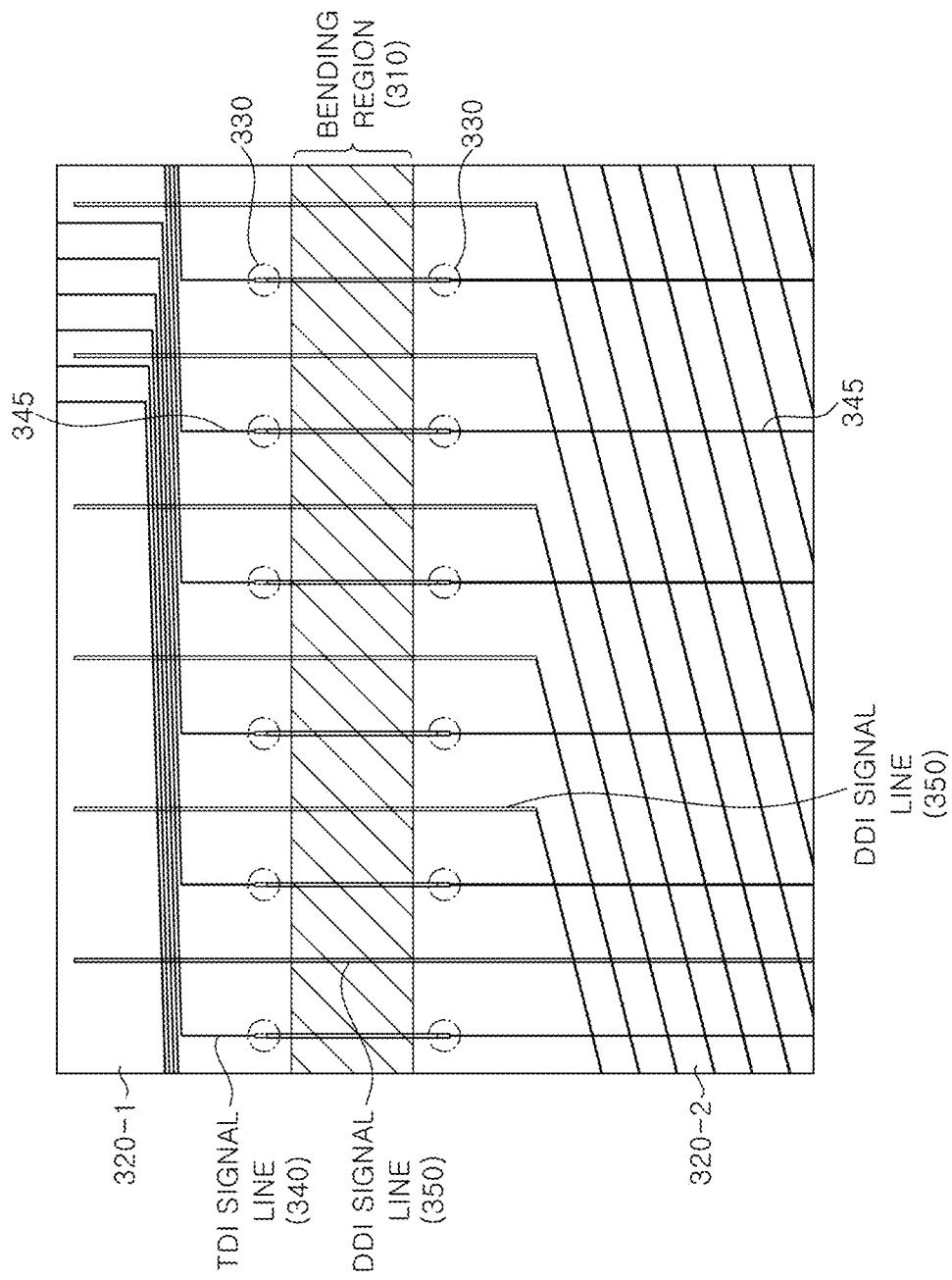

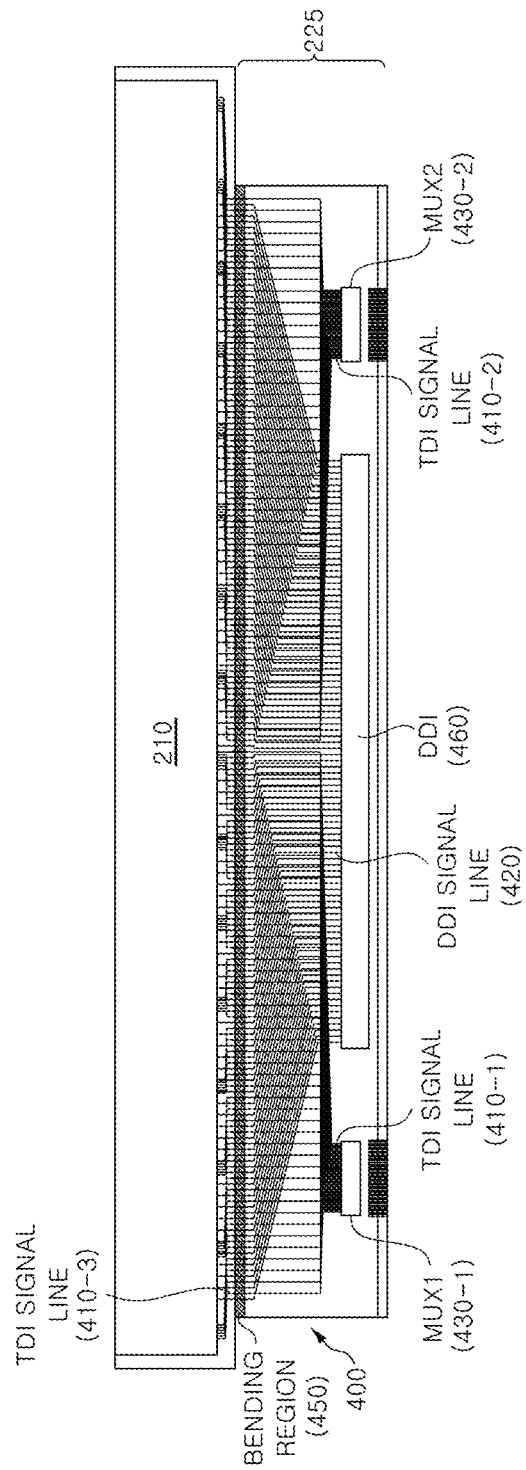
[FIG. 4]

[FIG. 5]
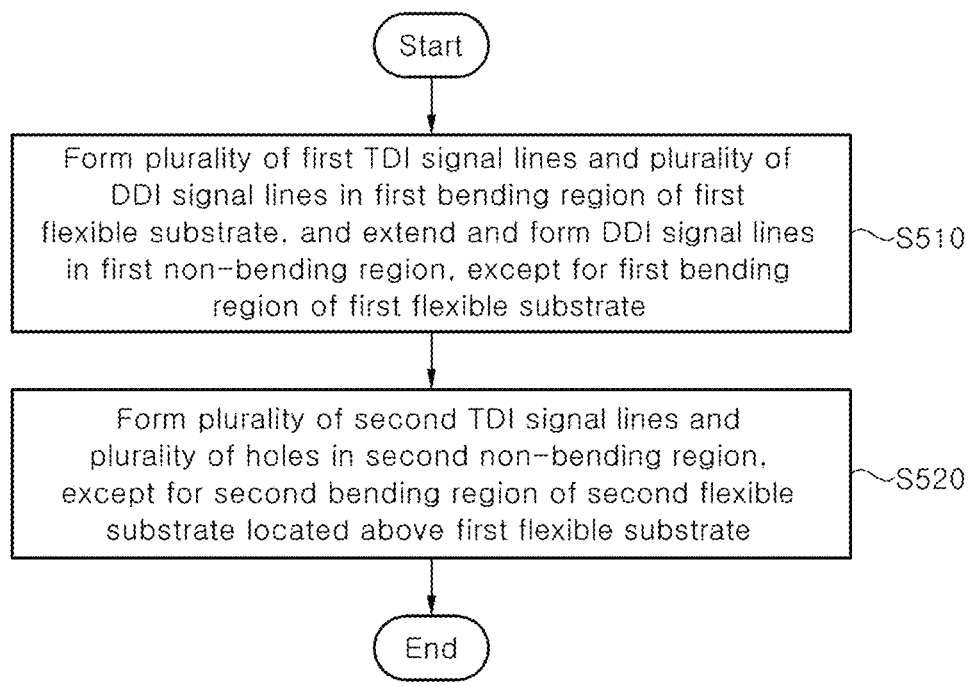

DISPLAY APPARATUS HAVING TOUCH FUNCTION AND SIGNAL LINE METHOD OF MOUNTING SIGNAL LINE OF DISPLAY APPARATUS

CROSS REFERENCE TO RELATED APPLICATIONS

This application is a U.S. National Stage of PCT/KR2019/002457 filed Mar. 4, 2019, which claims the priority benefit of Korean Patent Application No. 10-2018-0025854, Mar. 5, 2018, in the Korean Intellectual Property Office, the disclosures of which are incorporated herein by reference.

TECHNICAL FIELD

The present invention relates to a display apparatus having a touch function, and more particularly, to a method of disposing and mounting a Touch Drive IC (TDI) signal line and a Display Drive IC (DDI) signal line of a display apparatus having a touch function.

BACKGROUND ART

As a display apparatus, such as a smart phone, has evolved into full-screen in which upper and lower BM areas are reduced, a home button is removed for decreasing a lower Black Matrix (BM), and efforts are being made to reduce the fan-out area of Display Drive IC (DDI) and Touch Drive IC (TDI) signal lines to reduce an upper BM area. A DDI 140 for driving a display apparatus 100 and a TDI 120 for detecting a touch of a finger or a touch means are mounted to a Flexible Printed Circuit Board (FPCB) in various forms, such as a Chip On Film (COF).

In an operation of finally assembling a smart phone, the FPCB is bent and the DDI and TDI are sent to the rear of the display apparatus to be connected to a main board of the smart phone.

In this case, when the signal lines in the bending region are located in different layers, a crack is generated in the signal line due to a difference in a tensile rate. In order to solve the crack, in the related art, in order to prevent the signal line of the DDI and the signal line of the TDI from overlapping in the bending region, a DDI signal line 130 and a TDI signal line 110 are mounted so as not to overlap each other by disposing the TDI signal lines at both sides.

However, when the signal lines are mounted by using the related art, the generation of the crack in the signal line due to the overlap of the DDI signal line and the TDI signal line in the bending region is prevented, but as illustrated in FIG. 1, a length of a fan-out area 150 of the TDI signal increases which causes a problem in designing a full-screen display apparatus.

DISCLOSURE

Technical Problem

The present invention is conceived to solve the problem of the signal line mounting method in the related art, and relates to a design for optimally mounting a Touch Drive IC (TDI) signal line and a Display Drive IC (DDI) signal line of a display apparatus having a touch function.

Technical Solution

According to one aspect of the present invention, a display apparatus having a touch function includes: a first flexible substrate including a plurality of first Touch Drive IC (TDI) signal lines and a plurality of Display Drive IC (DDI) signal lines in a first bending region, the DDI signal lines being extended to a first non-bending region except for the first bending region; and a second flexible substrate located above the first flexible substrate and including a plurality of second TDI signal lines and a plurality of holes in a second non-bending region except for a second bending region of the second flexible substrate.

The display apparatus may further include an insulation substrate between the first flexible substrate and the second flexible substrate.

The plurality of second TDI signal lines formed in the second non-bending region of the second flexible substrate may be in contact with the plurality of first TDI signal lines formed in the first bending region of the first flexible substrate through the holes, respectively.

The TDI signal line and the DDI signal line formed in the first bending region of the first flexible substrate may not overlap each other.

The TDI signal lines formed in the first bending region of the first flexible substrate may be disposed between the DDI signal lines at a predetermined interval.

The display apparatus may further include a plurality of multiplexers which is connected to the plurality of second TDI signal lines formed in the second flexible substrate to multiplex and output a touch signal.

A DDI connected to the DDI signal line and a TDI connected to the TDI signal line may be mounted to a flexible PCB in a form of a Chip On Film (COF).

According to another aspect of the present invention, a method of mounting a signal line in a display apparatus having a touch function includes: forming a plurality of first TDI signal lines and a plurality of DDI signal lines in a first bending region of a first flexible substrate, and extending and forming the DDI signal lines in a first non-bending region, except for the first bending region of the first flexible substrate; and forming a plurality of second TDI signal lines and a plurality of holes in a second non-bending region, except for a second bending region of a second flexible substrate located above the first flexible substrate.

The method may further include disposing an insulation substrate between the first flexible substrate and the second flexible substrate.

The plurality of second TDI signal lines formed in the second non-bending region of the second flexible substrate may be in contact with the plurality of first TDI signal lines formed in the first bending region of the first flexible substrate through the holes, respectively.

The TDI signal line and the DDI signal line formed in the first bending region of the first flexible substrate may not overlap each other.

The TDI signal lines formed in the first bending region of the first flexible substrate may be disposed between the DDI signal lines at a predetermined interval.

The method may further include multiplexing and outputting a touch signal transmitted to the plurality of second TDI signal lines through a plurality of multiplexers formed in the second flexible substrate.

The method may further include mounting a DDI connected to the DDI signal line and a TDI connected to the TDI signal line to a flexible PCB in a form of a COF.

Advantageous Effects

According to the display apparatus having a touch function and the method of mounting the signal line of the display apparatus according to the present invention, the TDI signal line and the DDI signal line are mounted so as not to overlap in the bending region on the same flexible substrate, thereby preventing the problem, such as cracks, in the related art.

Further, according to the display apparatus having a touch function and the method of mounting the signal line of the display apparatus according to the present invention, it is possible to easily manufacture a full-screen display apparatus by reducing a length of a fan-out area of the TDI signal line.

DESCRIPTION OF DRAWINGS

FIG. 1 is a diagram schematically illustrating an example of a mounting method of a Touch Drive IC (TDI) signal line of a display apparatus in the related art.

FIG. 2A is a diagram illustrating a display apparatus adopting a method of mounting a TDI signal line and a Display Drive IC (DDI) signal line of the present invention.

FIG. 2B is a diagram schematically illustrating a method of mounting the TDI signal line and the DDI signal line of the present invention indicated with reference numeral 220 of FIG. 2A.

FIG. 3 is a diagram illustrating a mounting state of the TDI signal line and the DDI signal line around a bending region illustrated in FIG. 2 in detail.

FIG. 4 is a diagram illustrating an enlarged BM area of a display apparatus adopting the method of mounting the TDI signal line and the DDI signal line according to the present invention.

FIG. 5 is a flowchart illustrating a method of mounting the TDI signal line and the DDI signal line according to the present invention.

BEST MODE

For the full understanding of the present invention, the advantages of an operation of the present invention, and the purpose achieved by the implementation of the present invention, the accompanying drawings exemplifying an exemplary embodiment of the present invention and the contents described with reference to the accompanying drawings will be referred.

Hereinafter, the present invention will be described in detail by describing the exemplary embodiment of the present invention with reference to the accompanying drawings. The same reference numeral presented in each drawing denotes the same member.

Hereinafter, an exemplary embodiment of the present invention will be described in detail with reference to the accompanying drawings and Example.

FIG. 2A is a diagram illustrating a display apparatus adopting a method of mounting a Touch Drive IC (TDI) signal line and a Display Drive IC (DDI) signal line of the present invention.

FIG. 2A illustrates the case where a method of mounting a TDI signal line and a DDI signal line of the present invention is applied, and it is possible to form a fan-out area considerably shorter than the fan-out area of the signal line illustrated in FIG. 1, so that the method of the present invention is advantageous to manufacture a full-screen display apparatus 210.

TDI signal lines 230 and DDI signal lines 250 mounted in a BM region 225 of the display apparatus 210 are enlarged, which is indicated by reference numeral 220.

FIG. 2B is a diagram schematically illustrating a method of mounting the TDI signal line and the DDI signal line of the present invention indicated with reference numeral 220 of FIG. 2A.

The signal lines of the present invention are mounted on a first flexible substrate 270 and a second flexible substrate 260.

A particular method of mounting the signal line may be implemented by the general technology in the related art, so that a description thereof will be omitted.

The first flexible substrate 270 includes a plurality of first TDI signal lines 278 and a plurality of DDI signal lines 276 in a first bending region 272, and DDI signals 276 extended to first non-bending regions 274-1 and 274-2 except for the first bending region 272.

The second flexible substrate 260 is located above the first flexible substrate 270, and includes a plurality of second TDI signal lines 266 and a plurality of holes 268 in second non-bending regions 264-1 and 264-2 except for a second bending region 262 of the second flexible substrate 260.

The plurality of holes 268 may be formed at boundary points of the second bending region 262 and the second non-bending regions 264-1 and 264-2. However, the point, at which the hole is formed, is not strictly limited, and may also be formed at an inner side of the second bending region 262 at the boundary point or may also be formed at an outer side of the second non-bending region at the boundary point.

The plurality of holes 268 (which may be called "vias" in the present invention) formed in the second flexible substrate 260 needs to be formed so that the plurality of second TDI signal lines 268 formed in the second non-bending regions 264-1 and 264-2 of the second flexible substrate 260 is in contact with the plurality of first TDI signal lines 278 formed in the first bending region 272 of the first flexible substrate 270, respectively.

That is, particularly, a portion of a signal line F2-$t1$ formed in the second flexible substrate 262 needs to be in contact with a portion of a signal line F1-$t1$ formed in the first flexible substrate through the hole formed in the corresponding portion.

Similarly, a portion of a signal line F2-$b1$ formed in the second flexible substrate 262 needs to be in contact with a portion of a signal line F1-$b1$ formed in the first flexible substrate through the hole formed in the corresponding portion.

The remaining plurality of second TDI signal lines 266 and the remaining plurality of first TDI signal lines 278 illustrated in FIG. 2B are in contact with each other in a similar manner.

In FIG. 2B, 10 first TDI signal lines 278 are included in the first bending region 272 of the first flexible substrate 270, but the number of TDI signal lines is illustrative, and is not limited.

As described above, the 10 second TDI signal lines 266 formed in the second non-bending regions 264-1 and 264-2 of the second flexible substrate 260 and the 10 first TDI signal lines 278 formed in the first bending region 272 of the first flexible substrate 270 need to be formed to be in contact with each other through the holes or the vias formed in the corresponding regions.

A method of forming the holes in the second flexible substrate may be implemented by the general technology in the related art, so that a description thereof will be omitted.

The TDI signal lines 278 and the DDI signal lines 276 formed in the first bending region 272 of the first flexible substrate 270 are formed so as not to overlap each other.

The TDI signal lines 278 and the DDI signal lines 276 formed in the first bending region 272 of the first flexible substrate 270 of the present invention are formed on one same flexible substrate so as not to overlap each other, thereby preventing the generation of the crack in the related art and reducing a length of a fan-out area.

The TDI signal lines 278 formed in the first bending region 272 of the first flexible substrate 270 may be disposed between the DDI signal lines 276 at a predetermined interval.

The display apparatus of the present invention may further include an insulation substrate (not illustrated) between the first flexible substrate 270 and the second flexible substrate 260.

FIG. 3 is a diagram illustrating a mounting state of the TDI signal line and the DDI signal line around the bending area illustrated in FIG. 2 in detail.

FIG. 3 more substantially illustrates the mounting state of the signal lines schematically illustrated in FIG. 2B, and illustrates the state where the first flexible substrate 270 and the second flexible substrate 260 overlap each other in FIG. 2B.

In order to clearly illustrate the mounting state of the signal line in FIG. 3, the first flexible substrate 270 and the second flexible substrate 260 are not illustrated, and the second bending region 262 and the first bending region 272 are in an overlapping state, and the second non-bending regions 264-1 and 264-2 and the first non-bending regions 274-1 and 274-2 are in an overlapping state.

In a bending region 310 in which the second bending region 262 overlaps the first bending region 272, a plurality of first TDI signal lines 340 and a plurality of DDI signal lines 350 are formed.

The overlapping non-bending region 320-1 and 320-2 except for the overlapping bending region 310 illustrates the overlapping state of the second non-bending areas 264-1 and 264-2 and the first non-bending regions 274-1 and 274-2, and include an extended DDI signal lines 350.

The second non-bending areas 264-1 and 264-2 formed in the overlapping non-bending regions 320-1 and 320-2 include a plurality of second TDI signal lines 345.

The plurality of second TDI signal lines 345 formed in the overlapping non-bending regions 320-1 and 320-2 is in contact with the plurality of first TDI signal lines 340 formed in the overlapping bending region 310 through the plurality of holes 330, respectively.

In FIG. 3, the plurality of holes is slightly outside the boundary points of the bending region 310 overlapping the non-bending regions 320-1 and 320-2, that is, the overlapping non-bending regions 320-1 and 320-2.

FIG. 4 is a diagram illustrating an enlarged BM area of a display apparatus adopting the method of mounting the TDI signal line and the DDI signal line according to the present invention.

FIG. 4 is a diagram illustrating an enlarged BM area 225 of a display apparatus, and the method of mounting the TDI signal line and the DDI signal line according to the present invention is applied.

Although not particularly illustrated in FIG. 4, a bending region 450 is formed of a plurality of TDI signal lines and a plurality of DDI signal lines similar to the bending region 310 of FIG. 3.

The display apparatus of the present invention additionally includes a plurality of multiplexers 430-1 and 430-2 in order to reduce lengths of fan-out areas of the TDI signal lines 410-1, 410-2, and 410-3.

The display apparatus includes two multiplexers at a left side and a right side illustrated in FIG. 4.

The multiplexer is connected to a plurality of second TDI signal lines formed on a second flexible substrate to multiplex and output a touch signal.

A DDI 460 connected to the DDI signal line and a TDI connected to the TDI signal line may be mounted to a flexible PCB in the form of a Chip On Film (COF).

FIG. 5 is a flowchart illustrating a method of mounting the TDI signal line and the DDI signal line according to the present invention.

A method of mounting a signal line in a display apparatus having a touch function includes an operation of forming a plurality of first TDI signal lines and a plurality of DDI signal lines in a first bending region of a first flexible substrate, and extending and forming the DDI signal lines in a first non-bending region, except for the first bending region of the first flexible substrate (S510).

The method includes an operation of forming a plurality of second TDI signal lines and a plurality of holes in a second non-bending region, except for a second bending region of a second flexible substrate located above the first flexible substrate (S520).

The plurality of second TDI signal lines formed in the second non-bending region of the second flexible substrate and the plurality of first TDI signal lines formed in the first bending region of the first flexible substrate are formed to be in contact with each other through the holes formed in the second flexible substrate.

The TDI signal lines and the DDI signal lines formed in the first bending region of the first flexible substrate need to be formed so as not to overlap each other, so that the TDI signal lines may be disposed between the DDI signal lines at a predetermined interval.

In the present invention, a DDI connected to the DDI signal line and a TDI connected to the TDI signal line may be mounted to a flexible PCB in the form of a COF.

The present invention is not limited to the exemplary embodiments and the accompanying drawings, and those skilled in the art will appreciate that various changes, modifications, or substitutions may be possible within the scope of the technical spirit of the present invention.

The invention claimed is:

1. A display apparatus having a touch function, comprising:
    a first flexible substrate including a plurality of first Touch Drive IC (TDI) signal lines and a plurality of Display Drive IC (DDI) signal lines in a first bending region, the DDI signal lines being extended to first non-bending regions except for the first bending region; and
    a second flexible substrate located above the first flexible substrate and including a plurality of second TDI signal lines and a plurality of holes in second non-bending regions except for a second bending region of the second flexible substrate,
    wherein the first flexible substrate and the second flexible substrate overlap each other, the first bending region and the second bending region are in an overlapping state, and the first non-bending regions and the second non-bending regions are in an overlapping state.

2. The display apparatus of claim 1, further comprising:
    an insulation substrate between the first flexible substrate and the second flexible substrate.

3. The display apparatus of claim 1, wherein the plurality of second TDI signal lines formed in the second non-bending regions of the second flexible substrate is in contact with the plurality of first TDI signal lines formed in the first bending region of the first flexible substrate through the holes, respectively.

4. The display apparatus of claim 1, wherein the first TDI signal lines and the DDI signal lines formed in the first bending region of the first flexible substrate do not overlap each other.

5. The display apparatus of claim 4, wherein the first TDI signal lines formed in the first bending region of the first flexible substrate are disposed between the DDI signal lines at a predetermined interval.

6. The display apparatus of claim 1, further comprising:
a plurality of multiplexers which is connected to the plurality of second TDI signal lines formed in the second flexible substrate to multiplex and output a touch signal.

7. The display apparatus of claim 1, wherein a DDI connected to the DDI signal line and a TDI connected to the TDI signal line are mounted to a flexible PCB in a form of a Chip On Film (COF).

8. A method of mounting a signal line in a display apparatus having a touch function, the method comprising:
forming a plurality of first TDI signal lines and a plurality of DDI signal lines in a first bending region of a first flexible substrate, and extending and forming the DDI signal lines in first non-bending regions, except for the first bending region of the first flexible substrate; and
forming a plurality of second TDI signal lines and a plurality of holes in second non-bending regions, except for a second bending region of a second flexible substrate located above the first flexible substrate,
wherein the first flexible substrate and the second flexible substrate overlap each other, the first bending region and the second bending region are in an overlapping state, and the first non-bending regions and the second non-bending regions are in an overlapping state.

9. The method of claim 8, further comprising:
disposing an insulation substrate between the first flexible substrate and the second flexible substrate.

10. The method of claim 8, wherein the plurality of second TDI signal lines formed in the second non-bending regions of the second flexible substrate is in contact with the plurality of first TDI signal lines formed in the first bending region of the first flexible substrate through the holes, respectively.

11. The method of claim 8, wherein the first TDI signal lines and the DDI signal lines formed in the first bending region of the first flexible substrate do not overlap each other.

12. The method of claim 11, wherein the first TDI signal lines formed in the first bending region of the first flexible substrate are disposed between the DDI signal lines at a predetermined interval.

13. The method of claim 8, further comprising:
multiplexing and outputting a touch signal transmitted to the plurality of second TDI signal lines through a plurality of multiplexers formed in the second flexible substrate.

14. The method of claim 8, further comprising:
mounting a DDI connected to the DDI signal line and a TDI connected to the TDI signal line to a flexible PCB in a form of a COF.

* * * * *